(12) United States Patent
Yudahira

(10) Patent No.: US 6,919,726 B2
(45) Date of Patent: Jul. 19, 2005

(54) LEAKAGE DETECTION APPARATUS AND MOTOR CAR

(75) Inventor: Hirofumi Yudahira, Hamana-gun (JP)

(73) Assignee: Panasonic EV Energy Co., Ltd., Shizuoka (JP)

(*) Notice: Subject to any disclaimer, the term of this patent is extended or adjusted under 35 U.S.C. 154(b) by 0 days.

(21) Appl. No.: 10/500,193

(22) PCT Filed: Dec. 2, 2002

(86) PCT No.: PCT/JP02/12615
§ 371 (c)(1),
(2), (4) Date: Jun. 23, 2004

(87) PCT Pub. No.: WO03/060532
PCT Pub. Date: Jul. 24, 2003

(65) Prior Publication Data
US 2005/0012506 A1 Jan. 20, 2005

(30) Foreign Application Priority Data
Dec. 27, 2001 (JP) .................... 2001-398113

(51) Int. Cl.[7] ............................................ G01R 31/08
(52) U.S. Cl. ...................... 324/522; 324/511; 361/42
(58) Field of Search .................. 307/10.1; 324/503, 324/511, 522; 361/42

(56) References Cited

U.S. PATENT DOCUMENTS

| | | | | |
|---|---|---|---|---|
| 5,382,946 A | * | 1/1995 | Gale | 340/650 |
| 5,481,194 A | * | 1/1996 | Schantz et al. | 324/522 |
| 5,561,380 A | * | 10/1996 | Sway-Tin et al. | 324/509 |
| 5,686,839 A | * | 11/1997 | Takagi | 324/503 |
| 6,678,132 B1 | * | 1/2004 | Roden et al. | 361/42 |
| 6,833,708 B2 | * | 12/2004 | Furukawa | 324/426 |
| 6,856,137 B2 | * | 2/2005 | Carruthers et al. | 324/509 |

FOREIGN PATENT DOCUMENTS

| | | |
|---|---|---|
| JP | 11-23637 | 1/1999 |
| JP | 2000-009784 | 1/2000 |
| JP | 2001-037068 | 2/2001 |
| JP | 2002-098728 | 4/2002 |

* cited by examiner

Primary Examiner—Anjan Deb
Assistant Examiner—Walter Benson
(74) Attorney, Agent, or Firm—Hamre, Schumann, Mueller & Larson, P.C.

(57) ABSTRACT

A leakage detection apparatus is provided, capable of performing high-speed leakage detection during startup of a motor-vehicle such as an HEV. The apparatus includes a signal generator 31 for generating a signal whose frequency is set variably, a resistor 33 for attenuating the signal in cooperation with an insulation resistor between a high-voltage circuit 10 and a low-voltage circuit 20, a coupling capacitor 34 for capacitance-coupling one end of a resistant element to the high-voltage circuit, an LPF 35 whose cut-off frequency is set variably, for attenuating a high frequency component via the capacitive element to be superimposed on the signal via the resistant element, a leakage detection portion 381 for comparing an amplitude level of the signal via the LPF with a predetermined threshold value so as to detect the presence or absence of leakage between the high-voltage circuit and the low-voltage circuit, and a control portion 382 for setting the signal frequency of the signal generator and the cut-off frequency of the LPF after startup of the low voltage circuit and before startup of the high-voltage circuit to be higher than those after startup of the high-voltage circuit.

3 Claims, 5 Drawing Sheets

LEAKAGE DETECTION APPARATUS AND MOTOR CAR

TECHNICAL FIELD

The present invention relates to a leakage detection apparatus for detecting the presence or absence of leakage between a high-voltage circuit and a low-voltage circuit, used in motor-driven vehicles such as a pure electric vehicle (PEV), a hybrid electric vehicle (HEV), a hybrid vehicle with a fuel cell and a battery, or the like.

BACKGROUND ART

Conventionally, in a pure electric vehicle (PEV), a so-called hybrid electric vehicle (HEV) provided with an engine and a motor, and the like, a nickel-metal hydride (Ni—MH) battery mainly is used as a main power source for driving a motor due to its high energy density (that is, the ability to accumulate energy in a compact manner) and a high output density. In such a PEV and an HEV, a plurality of cells are combined to form one combined battery so as to supply a sufficient output with respect to a motor, and the combined battery is mounted as a high-voltage battery.

Such an HEV or the like includes a high-voltage circuit for driving a motor using a high-voltage battery as a driving source, and a low-voltage circuit for driving electronic equipment such as acoustic equipment using a low-voltage battery as a driving source. Furthermore, the high-voltage circuit includes an inverter for driving a motor.

In a motor-driven vehicle such as an HEV, in order to ensure the safety for a human body, it is required that leakage from a high-voltage circuit side to a low-voltage circuit side be detected, and when leakage is detected, the power from a high-voltage battery is interrupted.

FIG. 5 is a functional block diagram showing a partial configuration of a conventional motor-driven vehicle. In FIG. 5, a motor-driven vehicle 100 includes a high-voltage circuit 10 for driving a high-voltage load 11 such as a motor, a low-voltage circuit 20 for driving a low-voltage load 21 such as various kinds of electronic equipment, and a leakage detection apparatus 300 for detecting the presence or absence of leakage between the high-voltage circuit 10 and the low-voltage circuit 20.

The high-voltage circuit 10 includes a high-voltage battery 12, a second switch portion 13 for conducting/interrupting power from the high-voltage battery 12 with respect to the high-voltage load 11 side, and an inverter 14 for driving the high-voltage load 11.

The high-voltage battery 12 is composed of a plurality of secondary batteries (e.g., Ni—NH secondary batteries) 121 connected in series, and is capable of outputting a high voltage (e.g., 400 V) required for rotating a motor as a driving source for allowing the motor-driven vehicle 100 to run. The second switch portion 13 is composed of a relay and the like, and has a predetermined minimum current capacity required for driving the high-voltage load 11 such as a motor. The inverter 14 has a function of converting a DC current from the high-voltage battery 12 into an AC current so as to rotate the motor (e.g., 3-phase AC motor).

The low-voltage circuit 20 includes a first switch portion 23 capable of connecting the low-voltage battery 22 to the low-voltage load 21.

The low-voltage battery 22 is composed of a plurality of secondary batteries 221 connected in series, and is capable of outputting a low voltage (e.g., 12 V) required for driving the low-voltage load 21 such as an illumination display portion 211 and acoustic equipment 212 (e.g., a radio or a stereo) as electronic equipment. The first switch portion 23 is an ignition switch and turns on/off the electric system of an entire vehicle. The first switch portion 23 is operated with the second switch portion 13. The ON operation of the first switch portion 23 turns on the second switch portion 13, and the OFF operation of the first switch portion 23 turns off the second switch portion 13, via a switch control portion 382' of the leakage detection apparatus 300.

The leakage detection apparatus 300 includes a signal generator (fixed frequency) 310 for outputting a sine wave or square wave signal, an amplifier 32 for amplifying a signal from the signal generator 310 to a predetermined level, a resistor 33 for attenuating a signal from the amplifier 32 in accordance with an insulation resistor (not shown) between the high-voltage circuit 10 and the low-voltage circuit 20, a coupling capacitor for capacitance-coupling one end of the resistor 33 to the high-voltage circuit 10, a low-pass filter (LPF) 350 for removing a high-frequency component of a signal via the resistor 33 from the amplifier 32, an amplifier 36 for amplifying a signal from the LPF 350 to a predetermined level, an A/D converter 37 for sampling a signal from the amplifier 36 at a predetermined period and converting it into a digital signal, and a microcomputer ($\mu$COM) 38 for receiving a digital signal from the A/D converter 37.

Furthermore, the $\mu$COM 38 includes a leakage detection portion 381 for detecting the presence or absence of leakage by comparing a digital signal from the A/D converter 37 with a predetermined threshold value, and a switch control portion 382' for receiving an ON operation signal of the first switch portion 23, and turning on the second switch portion 13 when a detection completion signal from the leakage detection portion 381 indicates the absence of leakage and keeping the second switch portion 13 in an OFF state when the detection completion signal from the leakage detection portion 381 indicates the presence of leakage.

The leakage detection portion 381 compares a digital signal from the A/D converter 37 with a predetermined threshold value, and detects the presence of leakage, when an insulation resistor between the high-voltage circuit 10 and the low-voltage circuit 20 becomes a predetermined value (e.g., 100 k$\Omega$) or less and the digital signal decreases to a threshold value or less, and outputs the detection signal to the switch control portion 382' and the illumination display portion 211 to light a leakage display lamp.

The switch control portion 382' receives an ON operation signal of the first switch portion 23, and turns on the second switch portion 13 when the detection signal from the leakage detection portion 381 indicates the absence of leakage, and keeps the second switch portion 13 in an OFF state when the detection signal from the leakage detection portion 381 indicates the presence of leakage.

In the above-mentioned conventional leakage detection apparatus 300, the frequency of a signal output from the signal generator 310 is fixed at a low frequency (e.g., 1 Hz). The reason for this is as follows. In the signal from the signal generator 310, there is a switching noise of kHz order generated from the inverter 14 as noise to be superimposed via the coupling capacitor 34. In order to sufficiently attenuate this noise with an LPF 350, there is no choice but to set the signal generated by the signal generator 310 to be a low frequency (1 Hz).

Therefore, during startup, a period of time (confirmation time) required from a time when the ignition key switch is turned on to a time when the presence or absence of leakage is detected is prolonged.

DISCLOSURE OF INVENTION

The present invention has been achieved in view of the above problems, and its object is to provide a leakage detection apparatus capable of detecting leakage at a high speed during startup of an HEV, and a motor-driven vehicle having a leakage detection apparatus.

In order to achieve the above object, a leakage detection apparatus according to the present invention detects the presence or absence of leakage between a high-voltage circuit and a low-voltage circuit. The apparatus includes a signal generator for generating a signal whose frequency is set variably, a resistant element for attenuating the signal from the signal generator in cooperation with an insulation resistor between the high-voltage circuit and the low-voltage circuit, a capacitive element for capacitance-coupling one end of the resistant element to the high-voltage circuit, a low-pass filter whose cut-off frequency is set variably so as to pass a signal with a frequency set in the signal generator, for attenuating a high-frequency component via the capacitive element to be superimposed on the signal via the resistant element, a leakage detection portion for comparing an amplitude level of a signal via the low-pass filter with a predetermined threshold value, and detecting the presence or absence of leakage between the high-voltage circuit and the low-voltage circuit, and a control portion for setting the signal frequency of the signal generator and the cut-off frequency of the low-pass filter after startup of the low-voltage circuit and before startup of the high-voltage circuit to be higher than those after startup of the high-voltage circuit. The leakage detection apparatus with the above-mentioned configuration is used for a motor-driven vehicle.

According to the above-mentioned configuration, for example, during startup of a motor-driven vehicle such as an HEV, leakage can be detected at a high speed before startup of the high-voltage circuit.

In the leakage detection apparatus according to the present invention, the low-voltage circuit includes a low-voltage battery composed of a plurality of combined secondary batteries and a first switch portion for conducting/interrupting power from the low-voltage battery with respect to a low voltage load. The high-voltage circuit includes a high-voltage battery composed of a plurality of combined secondary batteries, and a second switch portion for conducting power from the high-voltage battery with respect to a high-voltage load after the first switch portion is turned on and the leakage detection portion detects the absence of leakage, or interrupting the power from the high-voltage battery with respect to the high-voltage load after the first switch portion is turned on and the leakage detection portion detects the presence of leakage.

According to the above-mentioned configuration, after the first switch portion (e.g., an ignition key switch) is turned on and before a high power is supplied from the high-voltage battery to the high-voltage load via the second switch portion, leakage can be determined without being influenced by noise.

The above configuration is preferable in the following point: when the high-voltage circuit includes an AC motor as the high-voltage load, and an inverter for driving the AC motor by converting a DC power from the high-voltage battery to an AC power, leakage can be determined exactly without being influenced by a switching noise due to the inverter.

Furthermore, in the leakage detection apparatus according to the present invention, it is preferable in terms of miniaturization of a circuit that the signal generator, the leakage detection portion, and the control portion can be configured in an electronic control unit (battery ECU) for a battery as a computer system.

In this case, the signal generator is composed of a PWM (pulse width modulation) signal generator embedded in a microcomputer ($\mu$COM) constituting a battery ECU, and a PWM signal output from the PWM signal generator is converted to a sine wave signal by a low-pass filter. Furthermore, the signal generator may be composed of a D/A (digital/analog) converter embedded in the $\mu$COM. This can vary the frequency of the signal generator in the $\mu$COM.

Furthermore, a sine wave signal may be converted to a digital signal by an A/D (analog/digital) converter embedded in the $\mu$COM, and leakage may be determined based on a data value of the digital signal. This can further reduce the number of circuit components outside of the $\mu$COM.

BEST MODE FOR CARRYING OUT THE INVENTION

Hereinafter, the present invention will be described by way of preferred embodiments with reference to the drawings.

(Embodiment 1)

Figure 1:
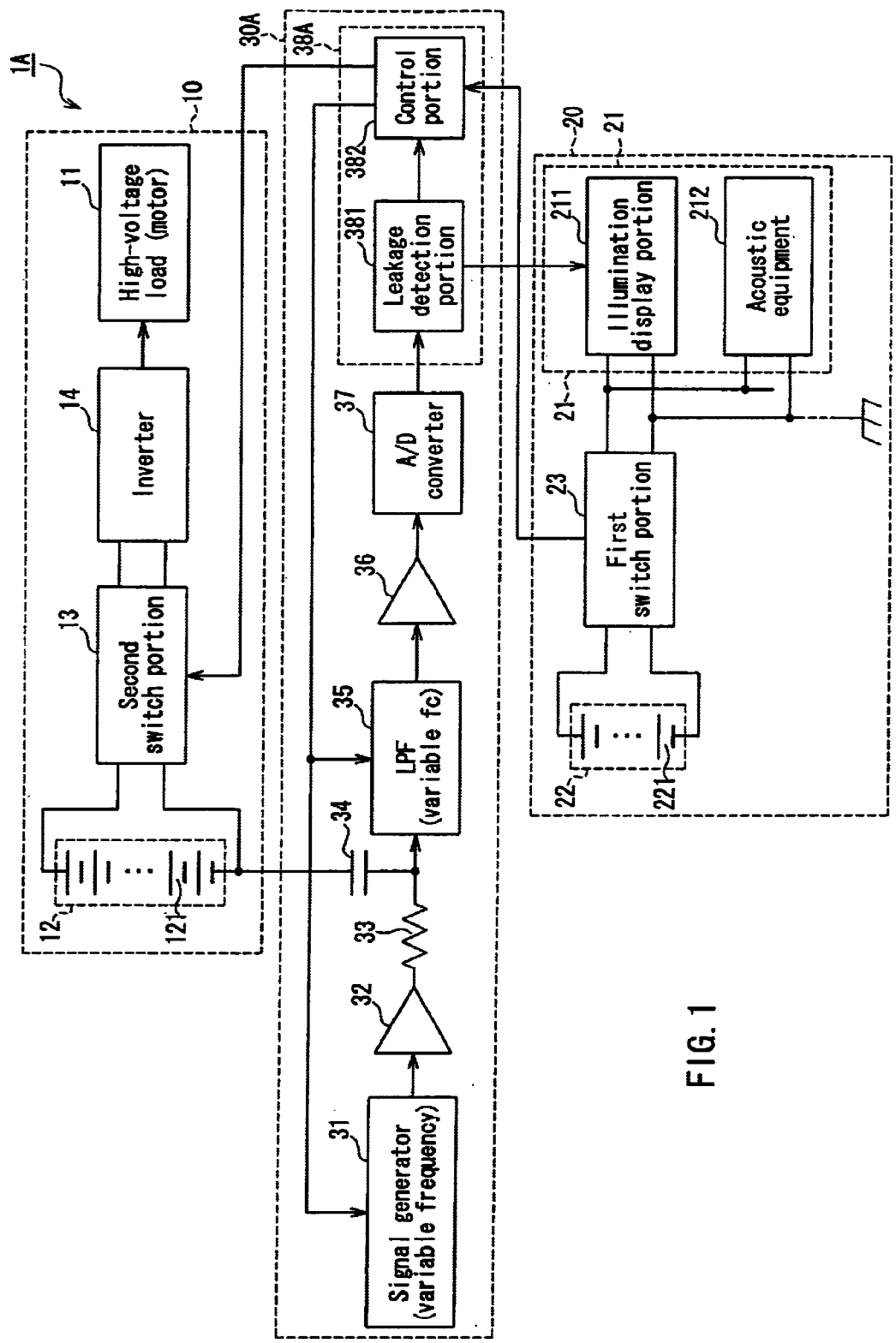
FIG. 1 is a functional block diagram showing an exemplary configuration of a leakage detection apparatus according to Embodiment 1 of the present invention.
Figure 5:
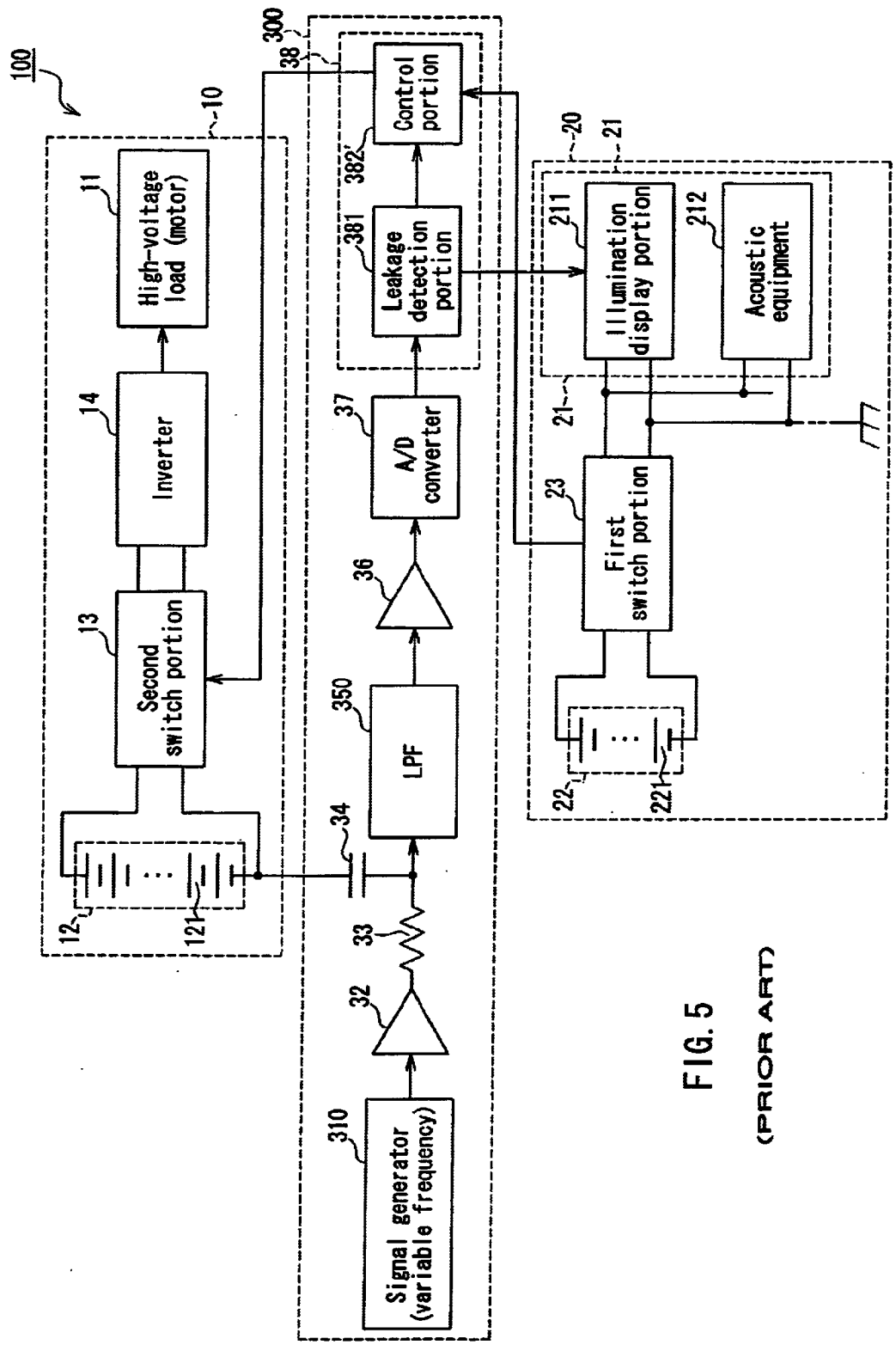
FIG. 5 is a function block diagram showing an exemplary configuration of a conventional leakage detection apparatus.

FIG. 1 is a functional block diagram showing an exemplary partial configuration of a motor-driven vehicle including a leakage detection apparatus according to Embodiment 1 of the present invention. In FIG. 1, the same functional elements as those in FIG. 5 showing a conventional example are denoted with the same reference numerals as those therein, and the description thereof will be omitted.

The present embodiment differs from a conventional example in that a signal generator 31 with a variable frequency (e.g., in a range of 1 Hz to 100 kHz) is provided in place of the signal generator 310 with a fixed frequency (1 Hz), and an LPF 35 (variable fc) with a variable cut-off frequency (e.g., in a range of 1 Hz to 100 kHz) is provided in place of the LPF 350 with a fixed cut-off frequency, and in that a control portion 382 is provided for setting the second switch portion in an OFF state while the first switch portion is turned on and the leakage detection portion 381 detects the presence or absence of leakage, and setting the cut-off frequency of the LPF 35 to be higher (e.g., in a range of 10 kHz to 100 kHz) than that during ordinary operation (1 Hz).

Next, the operation of the leakage detection apparatus thus configured will be described.

First, when the first switch portion 23 that may be an ignition key switch is turned on, the control portion 382 receives the ON operation signal to keep the second switch portion 13 in an OFF state, and sets an oscillation frequency of the signal generator 31 to be, for example, 10 kHz, and a cut-off frequency fc of the LPF 35 to be 10 kHz.

In this state, in the case where leakage does not occur, the insulation resistor between the high-voltage circuit 10 and the low-voltage circuit 20 is sufficiently large (e.g., several 100 kΩ). Therefore, a signal from the signal generator 31 through the amplifier 32 and the resistor 33 (e.g., 100 kΩ) is input to the A/D converter 37 via the LPF 35 and the amplifier 36, being attenuated slightly, sampled at a predetermined period, and input to the leakage detection portion 381 in the μCOM 38A as a digital signal. The leakage detection portion 381 compares the data value of a digital signal with a predetermined threshold value, and since the data value of the digital signal is larger than a predetermined threshold value, detects the absence of leakage.

Next, the control portion 382 receives a detection signal indicating the absence of leakage from the leakage detection portion 381, turns on the second switch portion 13, and enables the supply of power to the inverter 14, and sets the oscillation frequency of the signal generator 31 and the cut-off frequency of the LPF 35 to be 1 Hz during ordinary operation.

On the other hand, in the case where leakage occurs, the insulation resistor between the high-voltage circuit 10 and the low-voltage circuit 20 is small (e.g., 100 kΩ or less). Therefore, a signal from the signal generator 31 through the amplifier 32 and the resistor 33 (e.g., 100 kΩ) has its level attenuated by ½ or more, is input to the A/D converter 37 via the LPF 35 and the amplifier 36, sampled at a predetermined period, and is input as a digital signal to the leakage detection portion 381 in a μCOM 38A. The leakage detection portion 381 compares the data value of a digital signal with a predetermined threshold value, and since the data value of the digital signal is smaller than a predetermined threshold value, detects the presence of leakage, outputs the detection signal to the illumination display portion 211, and lights a leakage display lamp. Alternatively, the leakage detection portion 381 transmits information on the occurrence of a leakage state to an ECU on a vehicle side via an output portion provided with an interface circuit for communication for sending data.

Furthermore, the control portion 382 receives a detection signal indicating the presence of leakage from the leakage detection portion 381, and keeps the second switch portion 13 in an OFF state.

Conventionally, a switching noise (spike-shaped noise) of several kHz order due to the inverter 14 of the high-voltage circuit 10 is superimposed on a sine wave signal from the signal generator 310. Therefore, in order to attenuate the noise sufficiently with the LPF 350, it is required to fix the oscillation frequency of the signal generator 310 to be a low frequency (1 Hz). Because of this, a period of time (confirmation time) required for detecting the presence or absence of leakage is prolonged.

However, as described above, according to the present embodiment, before the second switch portion is turned on after the first switch portion 23 is turned on (i.e., before a switching operation is started by the inverter 14), the oscillation frequency of the signal generator 31 and the cut-off frequency of the LPF 35 are set variably to be, for example, 10 kHz under the condition of not being subjected to the influence of the noise, whereby a period of time required from a time when the first switch portion 23 is turned on to a time when the leakage detection portion 381 detects the presence or absence of leakage can be reduced substantially.

In the present embodiment, the oscillation frequency of the signal generator 31 and the cut-off frequency of the LPF 35 are set variably to be 10 kHz. However, in view of the circuit performance and cost, by further increasing the frequencies, the confirmation time further can be shortened.
(Embodiment 2)

Figure 2:
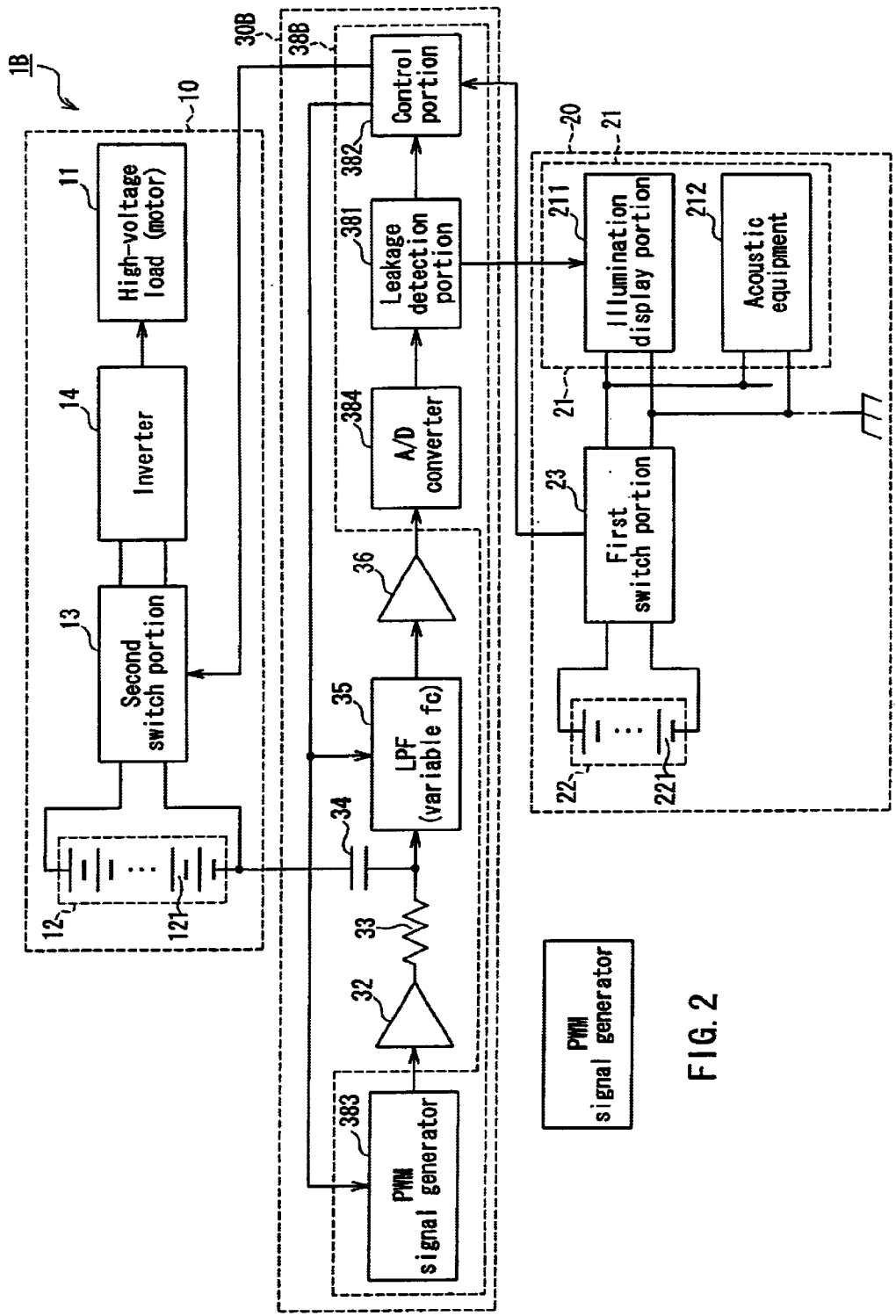
FIG. 2 is a functional block diagram showing an exemplary configuration of a leakage detection apparatus according to Embodiment 2 of the present invention.

FIG. 2 is a functional block diagram showing an exemplary partial configuration of a motor-driven vehicle including a leakage detection apparatus according to Embodiment 2 of the present invention. In FIG. 2, the same functional elements as those in FIG. 1 showing Embodiment 1 are denoted with the same reference numerals as those therein, and the description thereof will be omitted.

The present embodiment differs from Embodiment 1 in that a leakage detection apparatus 30B is configured using a PWM signal generator 383 built in a μCOM 38B in place of the signal generator 31 provided outside of the μCOM 38A, and using an A/D converter 384 embedded in the μCOM 38B in place of the A/D converter 37 provided outside of the μCOM38A.

The PWM signal output from the PWM signal generator 383 in the μCOM 38B is converted into a sine wave signal by the LPF 35 via the amplifier 32 and the resistor 33, and is converted into a digital signal by the A/D converter 384 in the μCOM 38B via the amplifier 36. The operation thereafter is the same as that in Embodiment 1.

Figure 3:
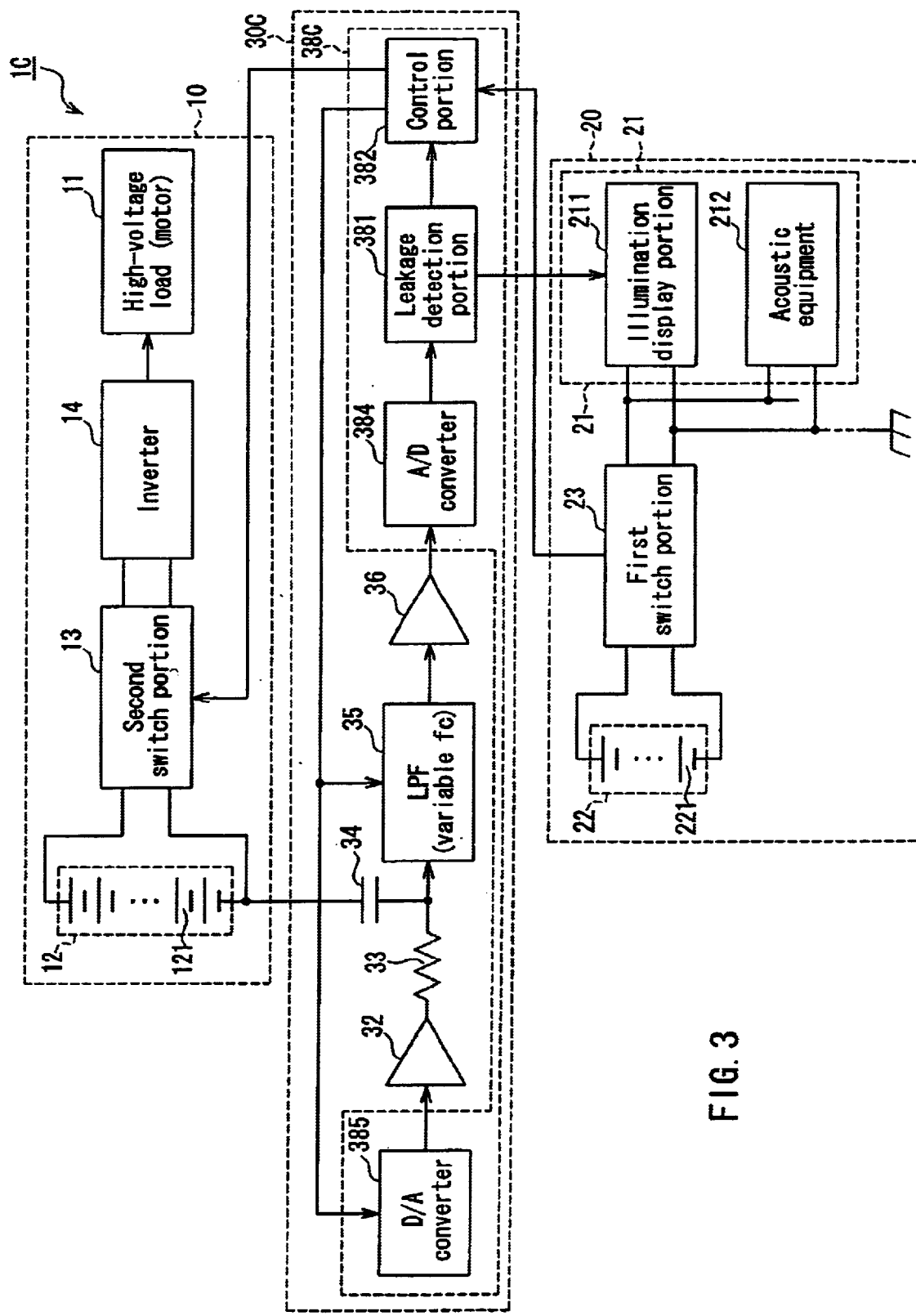
FIG. 3 is a functional block diagram showing a modified example of the leakage detection apparatus according to Embodiment 2 of the present invention.

FIG. 3 is a functional block diagram showing a modified example of a motor-driven vehicle including the leakage detection apparatus according to Embodiment 2 of the present invention. In FIG. 3, the same functional elements as those in FIG. 2 are denoted with the same reference numerals as those therein, and the description thereof will be omitted.

In the modified example, a leakage detection apparatus 30C is configured using a D/A converter 385 embedded in a μCOM 38C in place of the PWM signal generator 383 embedded in the μCOM 38B.

According to the above configuration, the number of circuit components other than the μCOM can be reduced.
(Embodiment 3)

Figure 4:
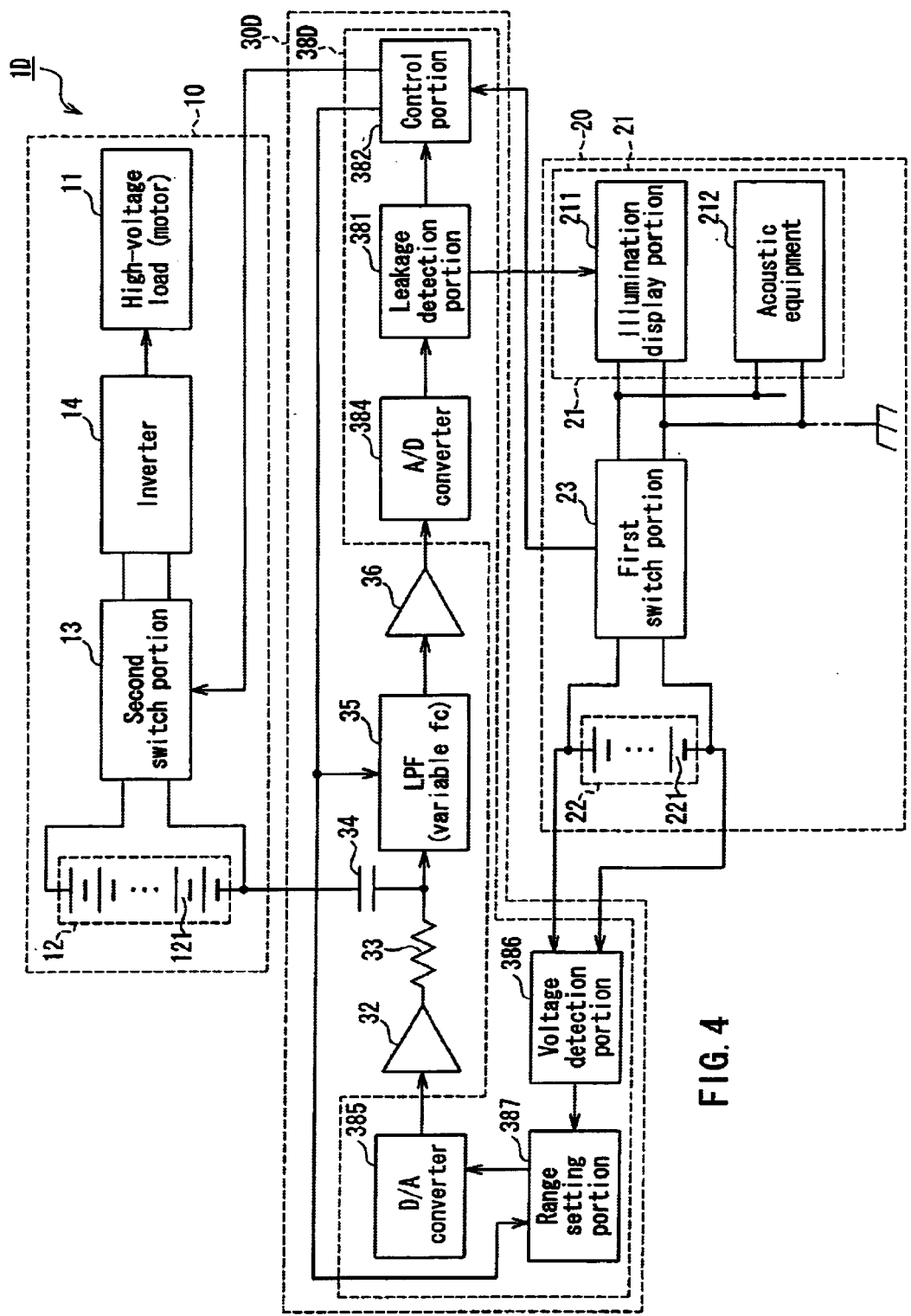
FIG. 4 is a functional block diagram showing an exemplary configuration of a leakage detection apparatus according to Embodiment 3 of the present invention.

FIG. 4 is a functional block diagram showing an exemplary partial configuration of a motor-driven vehicle including a leakage detection apparatus according to Embodiment 3 of the present invention. In FIG. 4, the same functional elements as those in FIG. 3 showing a modified example of Embodiment 2 are denoted with the same reference numerals as those therein, and the description thereof will be omitted.

In the present embodiment, in addition to the configuration of Embodiment 2, a voltage detection portion 386 for detecting a voltage level of the low-voltage battery 22, and a range setting portion 387 for setting variably the amplitude of a signal output from the D/A converter 385 based on the detection voltage from the voltage detection portion 386 in accordance with the control signal from the control portion 382, are provided in a μCOM 38D.

According to the above configuration, the voltage detection portion 386 monitors the voltage level of the low-voltage battery 22. During a leakage detection operation, when the detected voltage level is low (e.g., a minimum voltage of 8 V), the range setting portion 387 increases the level of a signal output from the D/A converter 385, and when the detected voltage level is high (e.g., 13.5 V during an alternator operation), the range setting portion 387 decreases the level of a signal output from the D/A converter 385. Thus, an S/N ratio can be enhanced, so that a leakage detection apparatus with excellent noise resistance can be realized.

In the present embodiment, the amplitude of a signal output from the D/A converter 385 is set variably. However, even when a variable gain amplifier capable of varying the gain in accordance with the detection voltage from the voltage detection portion 386 is used in place of the amplifier 32, 36 having a fixed gain, similar effects are obtained.

As described above, according to the present invention, for example, during startup of an HEV or the like, before a high-voltage circuit is started, leakage can be detected at a high speed without being influenced by various kinds of noises.

What is claimed is:

1. A leakage detection apparatus for detecting the presence or absence of leakage between a high-voltage circuit and a low-voltage circuit, comprising:

a signal generator for generating a signal whose frequency is set variably;

a resistant element for attenuating the signal from the signal generator in cooperation with an insulation resistor between the high-voltage circuit and the low-voltage circuit;

a capacitive element for capacitance-coupling one end of the resistant element to the high-voltage circuit;

a low-pass filter whose cut-off frequency is set variably so as to pass a signal with a frequency set in the signal generator, for attenuating a high-frequency component via the capacitive element to be superimposed on the signal via the resistant element;

a leakage detection portion for comparing an amplitude level of a signal via the low-pass filter with a predetermined threshold value, and detecting the presence or absence of leakage between the high-voltage circuit and the low-voltage circuit; and a control portion for setting the signal frequency of the signal generator and the cut-off frequency of the low-pass filter after startup of the low-voltage circuit and before startup of the high-voltage circuit to be higher than those after startup of the high-voltage circuit.

2. The leakage detection apparatus according to claim 1, wherein the low-voltage circuit includes a low-voltage battery composed of a plurality of combined secondary batteries and a first switch portion for conducting/interrupting power from the low-voltage battery with respect to a low voltage load, and the high-voltage circuit includes a high-voltage battery composed of a plurality of combined secondary batteries, and a second switch portion for conducting power from the high-voltage battery with respect to a high-voltage load after the first switch portion is turned on and the leakage detection portion detects the absence of leakage, or interrupting the power from the high-voltage battery with respect to the high-voltage load after the first switch portion is turned on and the leakage detection portion detects the presence of leakage.

3. A motor-driven vehicle comprising the leakage detection apparatus of claim 1.

* * * * *